(12) United States Patent
Ting

(10) Patent No.: US 7,208,803 B2
(45) Date of Patent: Apr. 24, 2007

(54) METHOD OF FORMING A RAISED SOURCE/DRAIN AND A SEMICONDUCTOR DEVICE EMPLOYING THE SAME

(75) Inventor: Steve Ming Ting, Bridgewater, NJ (US)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 222 days.

(21) Appl. No.: 10/839,197

(22) Filed: May 5, 2004

(65) Prior Publication Data

US 2005/0247983 A1 Nov. 10, 2005

(51) Int. Cl.
- H01L 29/76 (2006.01)
- H01L 29/94 (2006.01)
- H01L 31/062 (2006.01)
- H01L 31/113 (2006.01)
- H01L 31/119 (2006.01)

(52) U.S. Cl. ............ 257/408; 257/314; 257/315; 257/327; 257/336; 257/344; 257/347; 257/348; 257/349; 257/350; 257/351; 257/352; 257/353; 257/354; 257/521; 257/527; 257/627; 257/628; 257/900

(58) Field of Classification Search ........ 257/314–315, 257/336, 344, 408, 627–628, 327, 900, 347–354, 257/521, 527

See application file for complete search history.

(56) References Cited

U.S. PATENT DOCUMENTS

| | | | |
|---|---|---|---|
| 4,998,150 A | 3/1991 | Rodder et al. | |
| 5,023,676 A * | 6/1991 | Tatsuta | 257/280 |
| 5,827,774 A * | 10/1998 | Kitajima | 438/525 |
| 5,874,341 A * | 2/1999 | Gardner et al. | 438/301 |
| 5,970,330 A * | 10/1999 | Buynoski | 438/198 |
| 6,043,936 A | 3/2000 | Large | |
| 6,137,149 A | 10/2000 | Kodama | |
| 6,380,088 B1 * | 4/2002 | Chan et al. | 438/694 |
| 6,506,638 B1 * | 1/2003 | Yu | 438/156 |
| 6,506,649 B2 | 1/2003 | Fung et al. | |
| 6,508,693 B1 | 1/2003 | Bouten | |
| 6,646,288 B2 * | 11/2003 | Yamazaki et al. | 257/72 |
| 7,049,651 B2 * | 5/2006 | Mikolajick et al. | 257/315 |
| 7,064,377 B2 * | 6/2006 | Hagemeyer et al. | 257/315 |
| 2002/0063292 A1 | 5/2002 | Armstrong et al. | |
| 2002/0127798 A1 * | 9/2002 | Prall | 438/257 |
| 2003/0094674 A1 | 5/2003 | Ipposhi et al. | |
| 2003/0209752 A1 * | 11/2003 | Cai et al. | 257/314 |
| 2005/0093105 A1 * | 5/2005 | Yang et al. | 257/627 |

OTHER PUBLICATIONS

Drowley, C.I., et al., "Model for Facet and Sidewall Defect Formation During Selective Epitaxial Growth of (001) Silicon," Appl. Phys. Lett., Feb. 15, 1988, pp. 546-548, vol. 52, No. 7, American Institute of Physics.

(Continued)

Primary Examiner—Ida M. Soward
(74) Attorney, Agent, or Firm—Slater & Matsil, L.L.P.

(57) ABSTRACT

A method of forming a raised source/drain proximate a spacer of a gate of a transistor on a substrate, and a semiconductor device of an integrated circuit employing the same. In one embodiment, the method includes orienting the gate substantially along a <100> direction of the substrate. The method also includes providing a semiconductor material adjacent the spacer of the gate to form a raised source/drain layer of the raised source/drain oriented substantially along a <100> direction of the substrate.

10 Claims, 7 Drawing Sheets

OTHER PUBLICATIONS

Endo, N., et al., "Novel Device Isolation Technology with Selective Epitaxial Growth," Transactions on Electron Devices, Sep. 1984, pp. 1283-1288, vol. ED-31, No. 9, IEEE.

Endo, N. et al., "Scaled CMOS Technology USING SEG Isolatioin and Buried Well Process," IEEE Transactions on Electron Devices, Nov. 1986, pp. 1659-1666, vol. ED-33, No. 11, IEEE.

Ishitani, A., et al., "Facet Formation in Selective Silicon Epitaxial Growth," Japanese Journal of Applied Physics, Oct. 1985, pp. 1267-1269, vol. 24, No. 10.

Ishitani, A., et al., "Silicon Selective Epitaxial Growth and Electrical Properties of Epi/Sidewall Interfaces," Japanese Journal of Applied Physics, May 1989, pp. 841-848, vol. 28, No. 5.

Kitajima, H., et al., "Crystalline Defects in Selectively Epitaxial Silicon Layers," Japanese Journal of Applied Physics, Dec. 1983, pp. L783-L785, vol. 22, No. 12.

Loo, R., et al., "Successful Selective Epitaxial $Si_{1-x}Ge_x$ Deposition Process for HPT-BiCMOS and High Mobility Heterojunction pMOS Applications," Journal of the Electrochemical Society, 2003, pp. G638-G647, vol. 150, No. 10, The Electromechanical Society, Inc.

Matsumoto, T., et al., "Novel SOI Wafer Engineering, Using Low Stress and High Mobility CMOSFET with <100> Channel for Embedding RF/Analog Applications," IEDM 2002, pp. 663-666, IEEE.

Samavedam, S.B., et al., "Elevated Source Drain Devices Using Silicon Selective Epitaxial Growth," J. Vac. Sci. Technol. B, May/Jun. 2000, pp. 1244-1250, vol. 18, No. 3, American Vacuum Society.

Sayama, H., et al., "Effect of <100> Channel Direction for High Performance SCE Immune pMOSFET with less than 0.15μm Gate Length," IEDM Technical Digest, 1999, pp. 657-660, IEEE.

* cited by examiner

METHOD OF FORMING A RAISED SOURCE/DRAIN AND A SEMICONDUCTOR DEVICE EMPLOYING THE SAME

TECHNICAL FIELD

The present invention is directed, in general, to semiconductor devices and, more specifically, to a method of forming a raised source/drain, related method of forming a transistor, and a semiconductor device employing the same.

BACKGROUND

A raised source/drain of a semiconductor device such as a transistor generally refers to a source/drain with a raised source/drain layer (which forms at least a portion of a source or a drain thereof) above a surface of a substrate that provides a foundation for the transistor. Often-times, the raised source/drain is employed in transistors such that a metal contact is vertically offset from a surface of the substrate and a junction of the source/drain (also referred to as a "source/drain junction") by the addition of epitaxially grown semiconductor material. As a result of the vertical offset, source/drain junction leakage (a component of an overall leakage of the transistor) and parasitic source/drain series resistance (which degrades a current drive of the transistor) are reduced.

Constructing the raised source/drain, however, may give rise to certain challenges associated with a design of the transistor or, for that matter, any semiconductor device employing the same. For instance, the raised source/drain layer of the source/drain is typically formed by selective epitaxial growth such that film nucleation and growth occurs only on exposed areas of a crystalline substrate while preventing nucleation and growth on exposed adjacent dielectric layers. Selective epitaxial growth conditions by definition maintain high interfacial energy between the epitaxially grown material and the dielectric surface. Therefore, facets frequently form on edges of the raised source/drain layer to minimize an interfacial area with an adjacent dielectric material such as an oxide or nitride spacer about a gate of the transistor.

On a conventional transistor fabricated on a (001) substrate wherein the gate is oriented along the <110> direction, the facets are most commonly oriented along the {111} and {311} planes. Typically, a shape of the raised source/drain facet is constrained by a growth rate of a facet plane thereof. For example, inasmuch as a {111} plane has a relatively slower growth rate than other planes, the facet associated therewith tends to expand horizontally. As a result, the facets may cause a gap between the spacer and the raised source/drain layer formed about the gate.

If the gap between the raised source/drain layer and spacer is not attended to, subsequent formation of a silicide may create a spike penetrating through a source/drain junction that may ultimately short circuit the source/drain to the substrate. Additionally, inasmuch as the source/drain is typically formed by an ion implantation process after the spacers are formed, a depth of the source/drain junctions is influenced by the facets. For a better understanding of transistors employing raised source/drains, see, for instance, U.S. Pat. No. 4,998,150, entitled "Raised Source/Drain Transistor," issued Mar. 5, 1991, to Rodder, et al., and U.S. Pat. No. 6,137,149, entitled "Semiconductor Device having Raised Source-Drains and Method of Fabricating the same," issued Oct. 24, 2000, to Kodama, both of which are incorporated herein by reference.

The growth of the facets during the selective epitaxial growth process has been the subject of many references including a reference by Akihiko Ishitani, et al. (Ishitani) entitled "Silicon Selective Epitaxial Growth and Electrical Properties of EPI/Sidewall Interfaces," Japanese Journal of Applied Physics, Vol. 28, No. 5, May 1989, pp. 841–848, which is incorporated herein by reference. Ishitani proposes a silicon selective epitaxial growth process employing <100> oriented isolation structures (such as the spacers about the gate and the shallow trench isolation regions in the substrate) to suppress facets and stacking faults. Through the course of study, Ishitani observed facet-free selective epilayers proximate <100> oriented isolation structures. In accordance therewith, a reduction in a P-N junction leakage is experienced with devices employing the <100> oriented isolation structures. The reduction in the junction leakage is related to the facet free epilayers.

Therefore, it appears that reducing the number of facets associated with the selective epitaxial growth of the raised source/drain of a transistor has significant benefits to an operation thereof. More specifically, suppressing facet formation during the selective epitaxial growth of a raised source/drain is beneficial to reducing a junction leakage at the source/drain junction. As mentioned above, otherwise, unwanted salicide and dopant penetration may occur at the corners of the facets leading to potential short circuits. Stacking fault formation at the selective epilayer/dielectric interfaces is also possible depending on an orientation of the structures that form the transistor.

Accordingly, what is needed in the art is a semiconductor device such as a transistor and related process of forming the transistor that reduces the effects of facets on the edges of a raised source/drain that overcomes the deficiencies in the prior art.

SUMMARY OF THE INVENTION

These and other problems are generally solved or circumvented, and technical advantages are generally achieved, by advantageous embodiments of the present invention, which includes a method of forming a raised source/drain proximate a spacer of a gate of a transistor on a substrate, and a semiconductor device of an integrated circuit employing the same. In one embodiment, the method includes orienting the gate substantially along a <100> direction of the substrate. The method also includes providing a semiconductor material adjacent the spacer of the gate to form a raised source/drain layer of the raised source/drain oriented substantially along a <100> direction of the substrate.

In another aspect, the present invention provides a semiconductor device for use with an integrated circuit including a gate oriented substantially along a <100> direction of a substrate and spacers about opposing side walls of the gate. The semiconductor device also includes a source adjacent one of the spacers including a raised source/drain layer above an upper surface of the substrate and oriented substantially along a <100> direction of the substrate. The semiconductor device still further includes a drain adjacent another one of the spacers including a raised source/drain layer above an upper surface of the substrate and oriented substantially along a <100> direction of the substrate.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
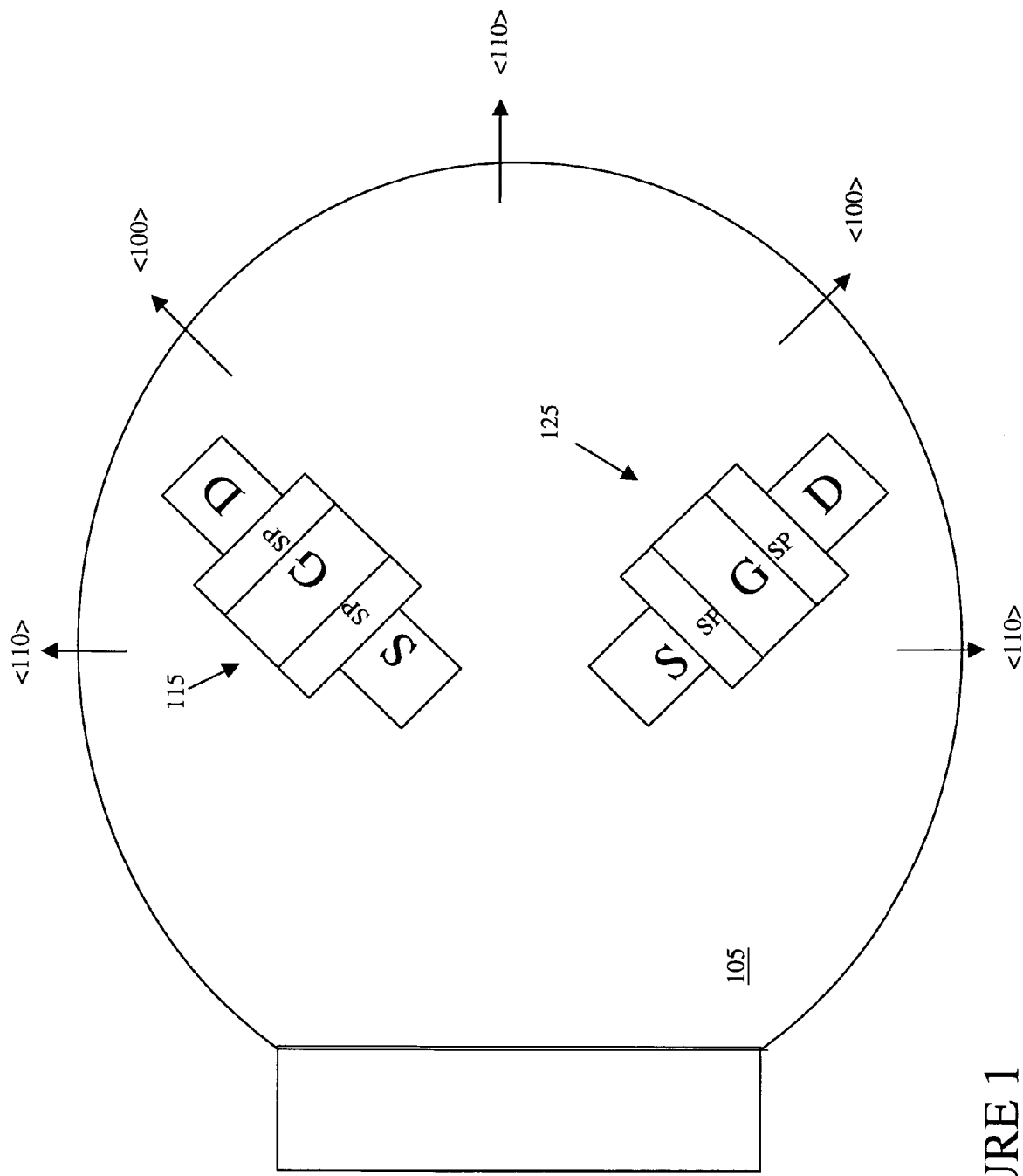
FIG. 1 illustrates a block diagram of an embodiment of a plurality of transistors demonstrating an orientation on a substrate in accordance with the principles of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, a method of forming a raised source/drain and a transistor, and a transistor employing the same. The principles of the present invention, however, may also be applied to other semiconductor devices of like construction and integrated circuits, in general. The advantages associated with the method and resulting transistor further exploit the benefits associated with shallow junction transistors.

By way of further foundation and as understood by those skilled in the art, silicon is a widely employed semiconductor material employable to construct semiconductor devices such as transistors. Most silicon substrates or wafers, which form the building block for the transistor, are single crystal silicon. In crystalline silicon, the atoms, which make up the solid, are arranged in a periodic fashion. If the periodic arrangement exists throughout the entire solid, the substance is defined as being formed of a single crystal. Conversely, if the solid is composed of a myriad of single crystal regions, the solid is referred to as polycrystalline material.

Silicon, as used in integrated circuits, can be in one of three forms, namely, single crystal silicon, polycrystalline silicon (referred to as polysilicon) and amorphous silicon. As noted above, silicon substrates are often fabricated to have a single crystal form. The periodic arrangement of atoms in a crystal is called the lattice. The crystal lattice also contains a volume representative of the entire lattice, which is referred to as a unit cell, that is regularly repeated throughout the crystal structure.

Silicon has a diamond cubic lattice structure, which can be represented as two interpenetrating face-centered cubic lattices. Thus, the simplicity of analyzing and visualizing cubic lattices can be extended to characterization of silicon crystals. In the description herein, references to various planes in silicon crystals will be made, especially to the {100} planes. The planes describe the orientation of the plane of silicon atoms relative to the principle crystalline axes. The numbers {xyz} are referred to as Miller indices and are determined from the reciprocals of the points at which the crystal plane of silicon intersects the principle crystalline axes. It should be understood by those skilled in the art that the notation {xyz} refers to all planes equivalent to the (xyz) plane as determined by symmetry of crystalline silicon. A reference will also be made herein to crystalline directions <xyz>, especially the <100> and <110> directions, which are defined as the normal directions to the respective {xyz} planes. See U.S. Patent Application Publication No. 2002/0063292 entitled "CMOS Fabrication Process Utilizing Special Transistor Orientation," to Armstrong, et al., published May 30, 2002, which is incorporated herein by reference, for an example of different orientations of crystalline silicon.

Referring now to FIG. 1, illustrated is a block diagram of an embodiment of a plurality of transistors demonstrating an orientation on a substrate 105 in accordance with the principles of the present invention. The first and second transistors 115, 125 are oriented such that current flowing between the source (generally designated "S") and drain (generally designated "D") of the respective first and second transistors 115, 125 is substantially along the <100> directions of the substrate 105. While a plurality of transistors are illustrated in the instant embodiment, the principles of the present invention are equally applicable to other semiconductor devices as well as to integrated circuits, in general.

Thus, in accordance with one embodiment of the present invention, the first and second transistors 115, 125 formed on the substrate 105 have a specific device orientation and a fabrication process employable to reduce faceting between the source/drain and a dielectric associated with the first and second transistors 115, 125. In accordance with the orientation described above, a gate (generally designated "G"), source S and drain D of the first and second transistors 115, 125 are substantially oriented along a <100> direction of the substrate 105. Using the first transistor 115 as an example, the orientation thereof reduces faceting on edges of the source S and drain D adjacent spacers (generally designated "SP") about the gate G of the first transistor 115.

Turning now to FIGS. 2 to 7, illustrated are cross sectional views of an embodiment of constructing a transistor according to the principles of the present invention. Beginning with FIG. 2, a gate is formed over a substrate 210 (e.g., composed of silicon or silicon germanium) employing conventional semiconductor processes. The substrate 210 may be a semiconductor layer formed over a buried oxide layer using silicon-on-insulator technology. In the present embodiment, a process of constructing a transistor (e.g., an N-type metal oxide semiconductor) is illustrated and described. Of course, the processes described herein are equally applicable to other types of transistors as well semiconductor devices in general. In the interim processing step illustrated in FIG. 2, the transistor includes the gate having a gate dielectric 225 and a gate electrode 230.

In the illustrated embodiment, the transistor is a self-aligned transistor and is shown at a point in the process wherein the gate has been patterned by, for instance, anisotropic dry etching. The dry etching may be either reactive ion etching or plasma etching, which are well known and widely accepted practices by those skilled in the art. The substrate 210 includes shallow trench isolation regions 240 formed by conventional processes. Those skilled in the art understand the processes to form the shallow trench isolation regions 240.

As mentioned above, the gate of the transistor includes the gate dielectric 225 which may be composed of a gate oxide layer (e.g., a thermally grown oxide or nitrided oxide) or a layer of high "k" dielectric material. While the gate electrode 230 of the transistor is composed of a polysilicon layer, those skilled in the art recognize that other materials such as metals (e.g., tungsten, tantalum, aluminum, nickel, ruthenium, rhodium, palladium, platinum, titanium, or molybdenum) and metal compounds (e.g., titanium nitride and tantalum nitride) may also be employed to advantage.

The layers that form the gate electrode 230 are typically blanket deposited by a chemical or physical vapor deposition process. The processes for forming the gate of the transistor are well known to those skilled in the art. In an exemplary embodiment, the gate dielectric 225 may be about 0.5 to 10 nanometers (nm) thick and the gate electrode 230 may be about 50 to 150 nm thick. The gate electrode 230 may consist of a single uniformly doped polysilicon layer or it may have an upper heavily doped portion and a lower undoped portion.

Figure 2:
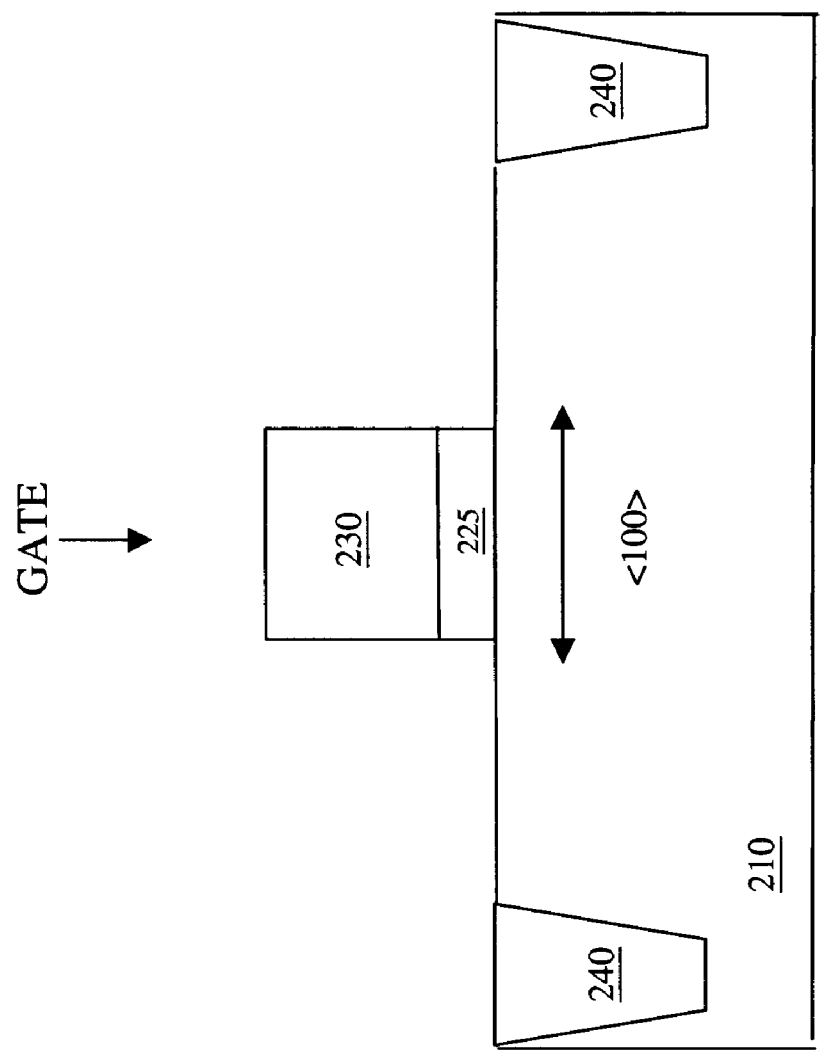
FIGS. 2 to 7 illustrate cross sectional views of an embodiment of constructing a transistor according to the principles of the present invention.

As illustrated in FIG. 2, the transistor is oriented such that current that flows between a source and drain of the transistor is substantially along a <100> direction of the substrate 210. In accordance therewith, the gate of the transistor is oriented substantially along a <100> direction of the substrate 210. For the reasons as stated herein, the selected orientation of the transistor reduces, among other things, faceting at edges of the source and drain thereof.

Figure 3:
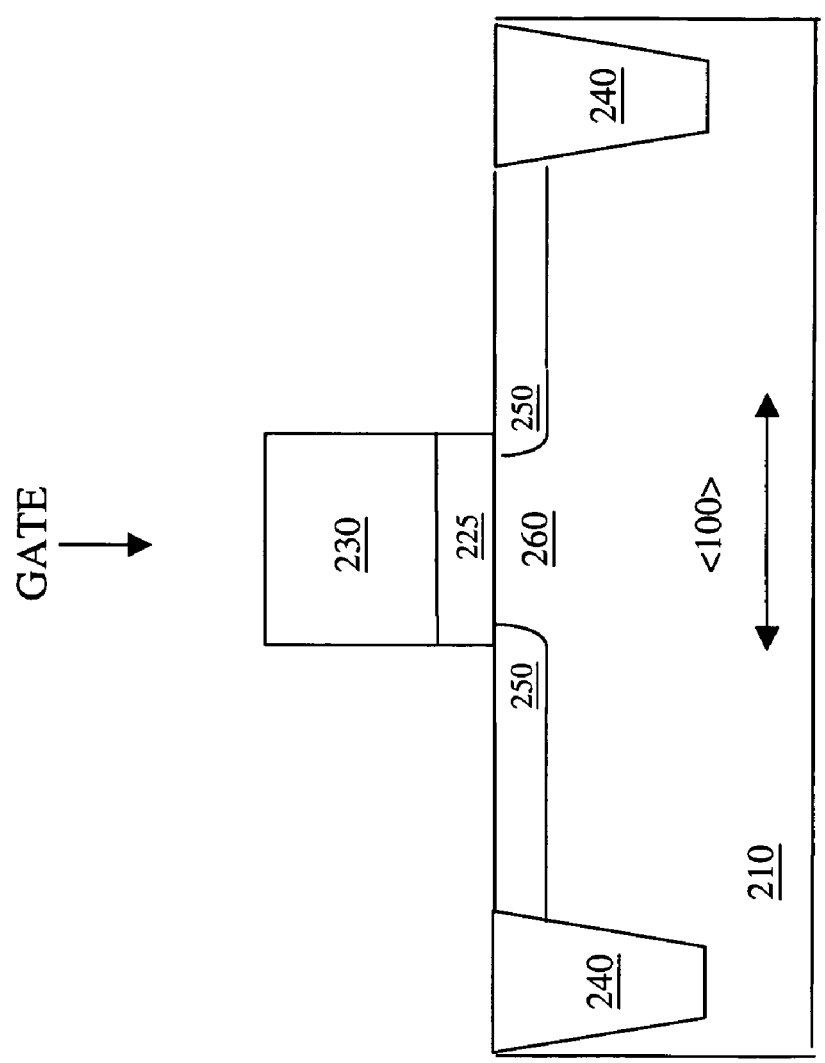

Turning now to FIG. 3, an ion implantation process is performed to form source/drain extension layers 250 below an upper surface of the substrate 210 adjacent a channel region 260 underlying the gate of the transistor. The source/drain extension layers 250 form shallow junctions within the substrate 210 adjacent the channel region 260 underlying the gate of the transistor. Typically, to form the source/drain extension layers 250 of the transistor (an N-type metal oxide semiconductor), arsenic ions are implanted into the substrate 210 and the gate serves as a mask. Of course, other N-type dopants such as antimony and phosphorous may also be employed to form the source/drain extension layers 250. The ion implantation process of arsenic may be performed at an energy level of about 1 to 5 keV and at a dose of $2 \times 10^{14}$ to $3 \times 10^{15}$ atoms/cm$^2$. An exemplary depth of the source/drain extension layers 250 is about 15 nm. In accordance with the orientation of the transistor as described herein, the source/drain extension layers 250 are oriented substantially along a <100> direction of the substrate 210.

Figure 4:
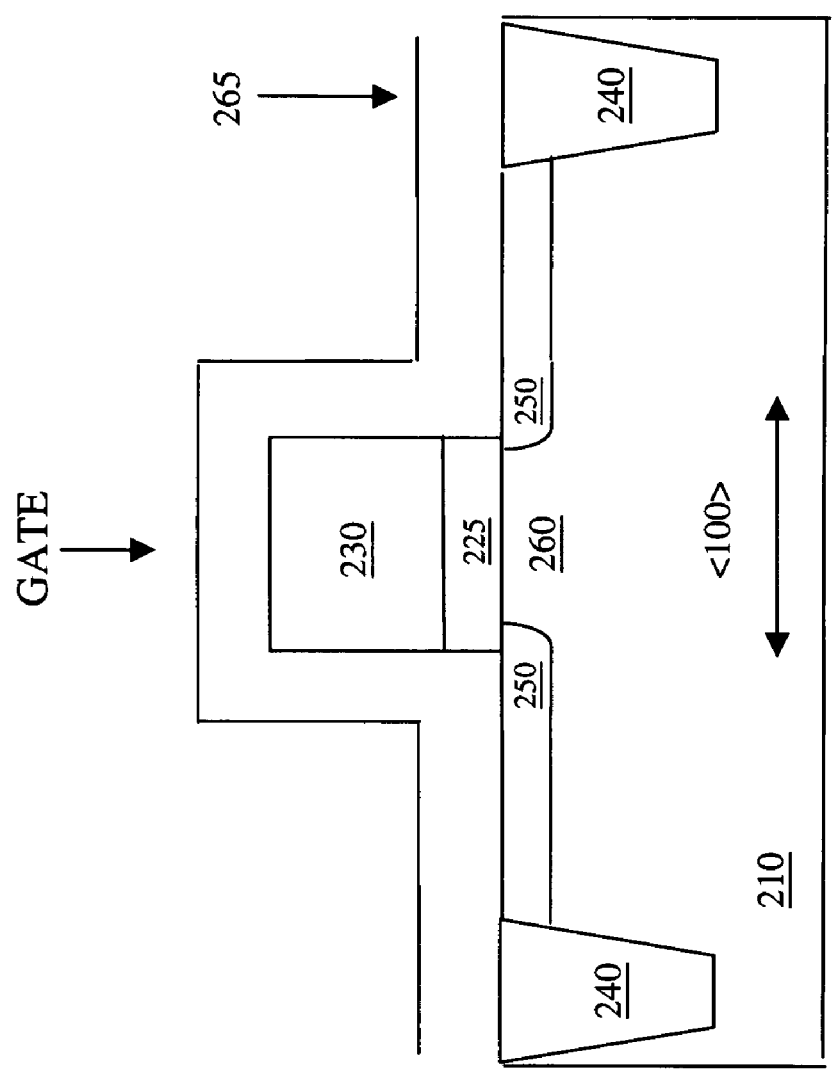
Figure 5:
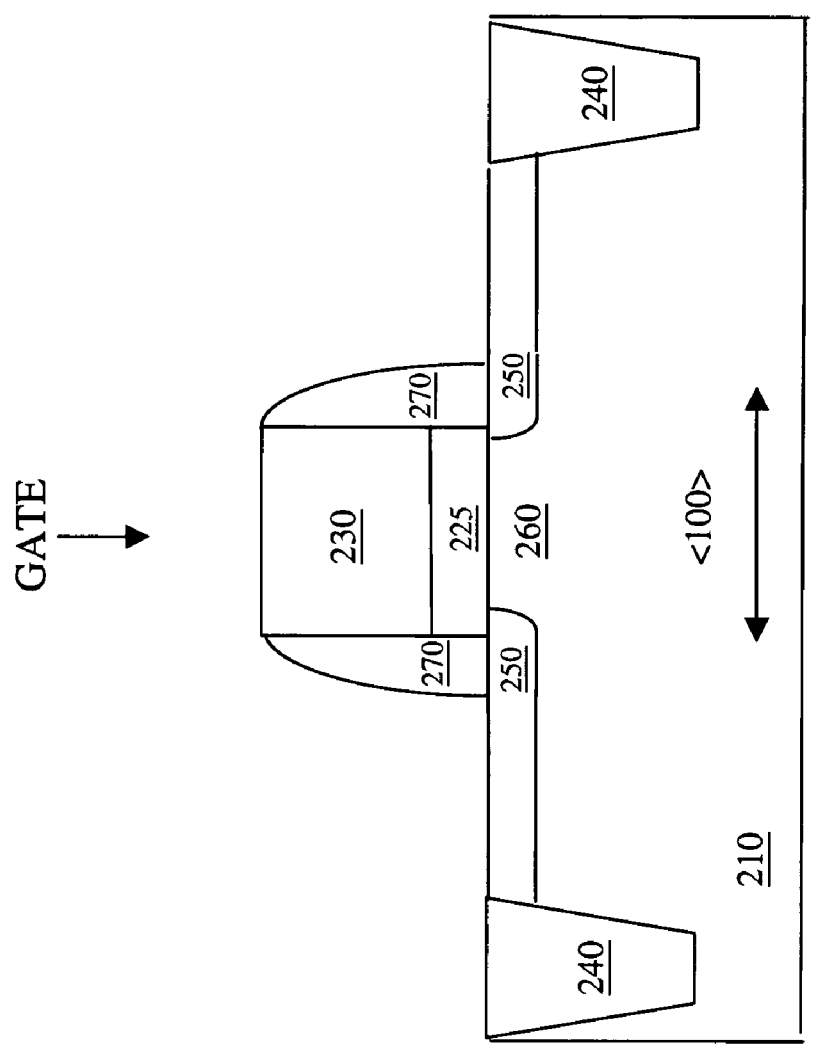

Turning now to FIGS. 4 and 5, an insulating layer 265 (e.g., a silicon nitride, silicon oxide, or a combination thereof) is blanket deposited over the substrate 210 and the transistor using, for instance, a low pressure chemical vapor deposition process. Thereafter, spacers 270 are formed on opposing walls about the gates of the transistor by dry etching the insulating layer 265 to the planar portions of the substrate 210. As depicted in FIG. 5, the spacers 270 taper toward the top of the gate of the transistor, and, typically, range from 20 to 50 nm wide.

Figure 6:
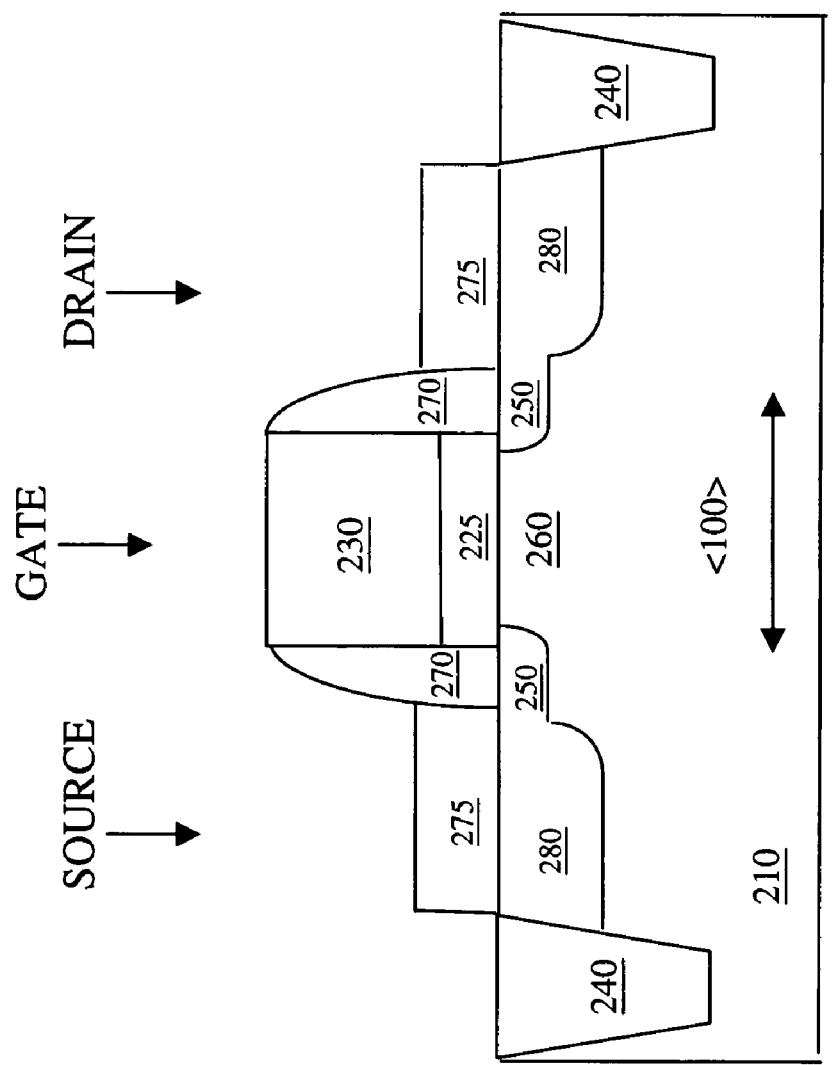

Turning now to FIG. 6, a selective epitaxial growth process such as a low pressure or ultra-high vacuum chemical vapor deposition process is performed at temperatures between 500 and 900 degrees Centigrade to deposit, for instance, silicon, silicon germanium or silicon carbide at a thickness of 5 nm to 50 nm to form raised source/drain layers 275 on the source and drain of the transistor. In accordance with the orientation of the transistor as described herein, the edges of the raised source/drain layers 275 of the source and drain are oriented substantially along a <100> direction of the substrate 210.

Thereafter, an ion implantation and rapid thermal anneal process in excess of 1000 degrees Centigrade is performed to dope the raised source/drain layers 275 and create source/drain regions 280 within the substrate. Typically, to dope the raised source/drain layers 275 and the source/drain regions 280 of the transistor (an N-type metal oxide semiconductor), phosphorous ions are implanted and the spacers 270 about the gate serve as a mask. Of course, other N-type dopants such as antimony and arsenic may also be employed to dope the raised source/drain layers 275 of transistor. The ion implantation process of phosphorous may be performed at an energy level of about 5 to 40 keV and at a dose of $1 \times 10^{13}$ to $5 \times 10^{15}$ atoms/cm$^2$. While an ion implantation process has been described to dope the raised source/drain layers 275, those skilled in the art will recognize that other processes such as an in situ doped epitaxial growth process may be employed to introduce N-type dopants into the raised source/drain layers 275 of the transistor during the epitaxial growth process.

Consequently, the transistor accommodates the advantages associated with shallow junctions in the substrate 210 associated with a source and drain thereof. As illustrated, the source/drain extension layers 250 are located under a portion of the spacers 270 to form an electrical connection between the source and drain (as hereinafter described), and the channel region 260 underlying the gate of the transistor. A depth of the junction, however, is quite shallow thereby preserving the benefits associated with transistors exhibiting shallow junctions, in particular reduced short channel effect and "off" current or leakage without compromising "on" current.

Figure 7:
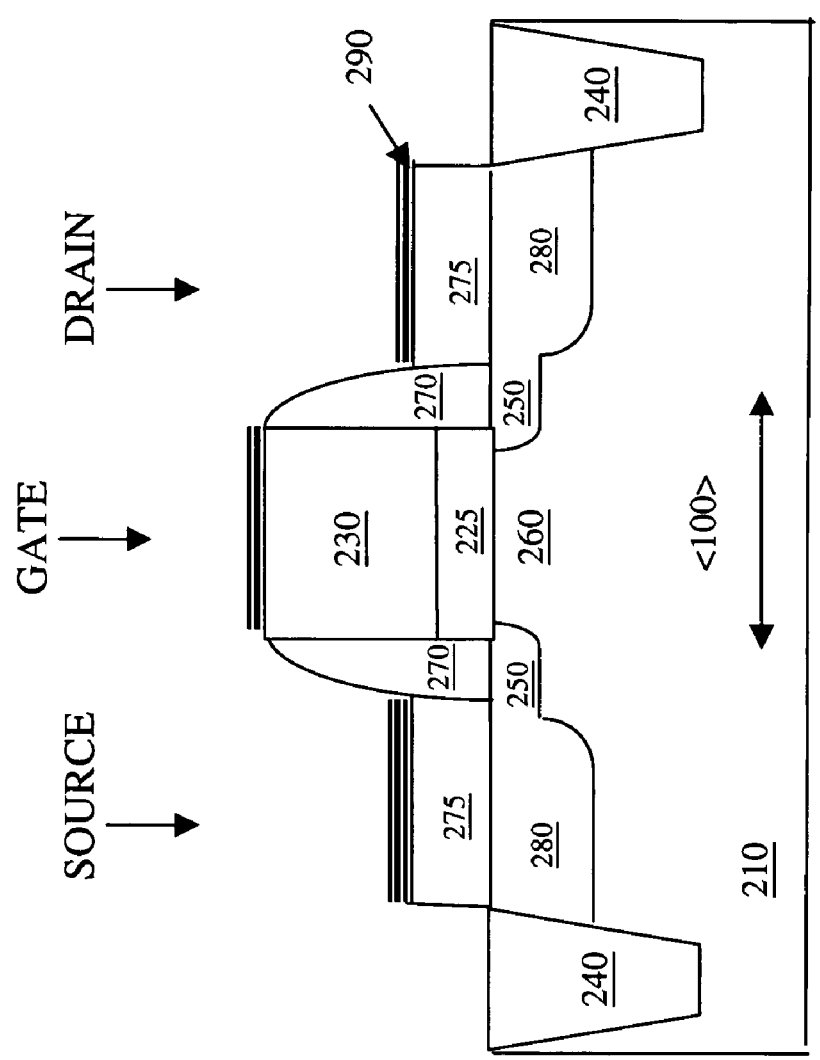

Turning now to FIG. 7, a salicide process is hereinafter performed to create contacts 290 for the gate, source and drain of the transistor. The salicide processing involves deposition of a metal that forms an intermetallic compound with silicon, but does not react with silicon oxides, nitrides, or oxynitrides under normal processing conditions. Metals commonly employed in salicide processing include platinum, titanium, nickel, tungsten and cobalt, each of which forms very low resistivity phases with silicon. The metal is deposited in a substantially uniform thickness over all exposed surface features of the substrate 210 and the transistor, preferably by a physical vapor deposition process (e.g., sputtering from an ultra pure target utilizing an ultra-high vacuum, multi-chamber DC magnetron sputtering system).

After deposition, the metal layer blankets a top surface of the gate electrode 230, the spacers 270 about the gate, the raised source/drain layers 275 of the source and drain, and the shallow trench isolation regions 240. As a result of thermal processing (e.g., a rapid thermal annealing process), the metal layer reacts with underlying silicon to form electrically conductive metal silicide layers on a top surface of the gate, source and drain of the transistor. Unreacted portions of the metal layer (e.g., the spacers 270 about the gate and the shallow trench isolation regions 240) are then removed employing, for instance, a wet chemical etching process selective to the metal silicide layers. The metal silicide layers form contacts 290 for the gate, source and drain of the transistor.

Thus, a method of forming a raised source/drain, a method of forming a transistor and a transistor with readily attainable and quantifiable advantages has been introduced.

Those skilled in the art should understand that the previously described embodiments of the transistor and related method of forming the transistor are submitted for illustrative purposes only and that other embodiments capable of providing a raised source/drain while reducing the effects of facets thereon are well within the broad scope of the present invention.

As mentioned above, faceting at the edges of a raised source/drain detract from a contact between the raised source/drain and a dielectric such as a spacer about the gate of the transistor. By orienting the gate, source and drain substantially along a <100> direction of the substrate, the growth of facets is substantially reduced, if not avoided altogether. Consequently, the disadvantages associated with faceting in semiconductor devices such as a potential to short circuit a source/drain to a substrate is avoided.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transistor, comprising:
   a gate oriented substantially along a <100> direction of a substrate and having a spacer on a wall thereof; and
   a source/drain adjacent said spacer of said gate that includes a raised source/drain layer above an upper surface of said substrate and oriented substantially along a <100> direction of said substrate.

2. The transistor as recited in claim 1 wherein said gate further comprises a gate electrode and a gate dielectric located on said substrate.

3. The transistor as recited in claim 1 wherein said gate and source/drain further comprise a contact.

4. The transistor as recited in claim 1 wherein said source/drain further includes a source/drain extension layer below said upper surface of said substrate and adjacent a channel region underlying said gate.

5. The transistor as recited in claim 4 wherein said source/drain further includes a source/drain region below said upper surface of said substrate and adjacent a source/drain extension layer.

6. A semiconductor device for use with an integrated circuit, comprising:
   a gate oriented substantially along a <100> direction of a substrate;
   spacers about opposing side walls of said gate;
   a source adjacent one of said spacers including a raised source/drain layer above an upper surface of said substrate and oriented substantially along a <100> direction of said substrate; and
   a drain adjacent another one of said spacers including a raised source/drain layer above an upper surface of said substrate and oriented substantially along a <100> direction of said substrate.

7. The semiconductor device as recited in claim 6 wherein said gate, said source and said drain each comprise a contact.

8. The semiconductor device as recited in claim 6 wherein said gate includes a gate dielectric and gate electrode.

9. The semiconductor device as recited in claim 6 wherein said source and said drain each include a source/drain extension layer below said upper surface of said substrate and adjacent channel region underlying said gate.

10. The semiconductor device as recited in claim 9 wherein said source and said drain each include a source/drain region about said source/drain extension layer.

* * * * *